US006814838B2

(12) United States Patent
Weichart

(10) Patent No.: US 6,814,838 B2
(45) Date of Patent: Nov. 9, 2004

(54) VACUUM TREATMENT CHAMBER AND METHOD FOR TREATING SURFACES

(75) Inventor: Juergen Weichart, Balzers (LI)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/821,787

(22) Filed: Mar. 29, 2001

(65) Prior Publication Data

US 2002/0000368 A1 Jan. 3, 2002

Related U.S. Application Data

(63) Continuation of application No. PCT/CH99/00399, filed on Aug. 30, 1999.

(30) Foreign Application Priority Data

Sep. 30, 1998 (CH) .............................................. 1986/98

(51) Int. Cl.$^7$ .......................... C23C 14/34; C23C 16/00
(52) U.S. Cl. ........................... 204/192.12; 204/192.17; 204/298.06; 204/298.08; 204/298.11; 118/723 I; 118/723 IR; 156/345.48; 156/354.49
(58) Field of Search ...................... 156/345.48, 345.49, 156/345; 118/723 I, 723 IR; 204/298.06, 298.08, 298.11, 192.12, 192.17

(56) References Cited

U.S. PATENT DOCUMENTS

| 4,431,901 A | * | 2/1984 | Hull ....................... 219/121.52 |
| 4,999,096 A | * | 3/1991 | Nihei et al. ............... 204/192.3 |
| 5,234,529 A |   | 8/1993 | Johnson ....................... 156/345 |
| 5,449,433 A | * | 9/1995 | Donohoe .................... 438/731 |
| 5,681,418 A | * | 10/1997 | Ishimaru ..................... 156/345 |

FOREIGN PATENT DOCUMENTS

| EP | 782172 A2 | 7/1997 |
| EP | 801413 A1 | 10/1997 |
| WO | WO 96/13051 | 5/1996 |
| WO | WO 99/03313 | 1/1999 |

* cited by examiner

Primary Examiner—Rodney G. McDonald
(74) Attorney, Agent, or Firm—Crowell & Moring LLP

(57) ABSTRACT

The invention relates to a vacuum treatment chamber for work pieces which comprises at least one induction coil for at least co-generating a treatment plasma in a discharge chamber which is located in the interior of the coil. It also comprises a screen which is arranged between the discharge chamber and the coil, and which is coaxial in relation to the axis of the coil. The screen comprises slots which have a directional component which is parallel to the coil axis. The screen is formed by a self-contained body. The slots are provided along at least the main part of the body's circumference in a slot density per circumferential length unit of S=(number of slots)/cm equaling $0.5 \leq S$.

28 Claims, 3 Drawing Sheets

VACUUM TREATMENT CHAMBER AND METHOD FOR TREATING SURFACES

CROSS-REFERENCE TO RELATED APPLICATIONS

This application is a continuation of International Application No. PCT/CH99/00399, with an international filing date of Aug. 30, 1999.

BACKGROUND AND SUMMARY OF THE INVENTION

The present invention relates to vacuum treatment chambers for work pieces and for treatment methods using the same. In a preferred embodiment, a vacuum treatment chamber for work pieces comprises at least one induction coil for at least co-generating a treatment plasma in a discharge chamber which is located in the interior of the coil.

It is generally known in the art that plasmas can be generated inductively and/or capacitively in vacuum treatment chambers for work pieces.

In the context of capacitive plasma generation, electrodes that are envisioned inside the vacuum chamber are connected with different electric potentials, such as e.g. DC-or HF- potentials, which produces an electric field between the electrodes, similar to that of a capacitor that uses the vacuum as dielectric.

At least one induction coil is envisioned for the inductive plasma generation. The coil surrounds the plasma discharge chamber, and an induction field is generated inside the chamber.

As mentioned previously, frequently, the plasma undergoes a combination of capacitive and inductive excitement; in part this also applies for connected plasmas in which a virtual 'stand by plasma' is inductively generated and the capacitively injected power is switched on and off.

To inductively inject the induction field into the discharge chamber it is possible for the induction coil to be exposed vis-a-vis the discharge chamber; but preferably it is separated from the latter by way of a dielectric wall, and is, for the most past, arranged positioned on the outside in relation to the vacuum chamber, or it is, if necessary, embedded in the material of the dielectric wall. A vacuum treatment chamber in which capacitive and inductive plasma generation are used in combination is known in the art from, for example, European Patent No. 0 271 341.

If electrically conductive particles are released inside a chamber, in which a plasma is inductively at least co-produced, such as e.g. during sputter-etching of electrically conductive work piece surfaces or during sputter-coating of work pieces with electrically conductive layers or during PECVD processes that produce electrically conductive particles, the problems described below occur.

If the induction coil is freely exposed to the discharge chamber inside the treatment chamber, there results the formation of an interference layer on the induction coil. With increasing duration of the process this leads to the chipping of particles from the interference layer followed by the corresponding impairment of the process.

If, as preferred, the induction coil is separated from the discharge chamber by way of a dielectric material, the result is that with increasing duration of the process an increasingly thick layer of electrically conductive material is formed on the dielectric wall. This reduces the power that was inductively injected into the discharge chamber and converts it increasingly to heat in the electrically conductive interference layer.

U.S. Pat. No. 5,569,363 addresses these problems that occur inside a sputter treatment chamber with capacitive high frequency and inductive plasma excitement using an induction coil that is arranged outside of a dielectric wall. To resolve the problem of the dielectric inside wall becoming coated with an interference layer consisting of electrically conductive material that patent envisions a cylindrical steel screen with a thickness of approximately 0.1 mm between the discharge chamber and the dielectric wall. The screen is continuously slotted parallel to the axis of the induction coil. This longitudinal slot prevents rotating circular currents from developing inside the metallic cylinder screen, because their path is interrupted by the slot. Also with respect to the deposition of electrically conductive layers on the inside wall of the cylinder this interruption remains effective. It is in fact the screen that protects the dielectric wall from becoming coated with electrically conductive particles. A disadvantageous aspect of this method is the fact that the inductive power injection is considerably reduced if a conductive screen such as this is envisioned.

Similarly, a vacuum treatment chamber is known in the art from European Patent No. 0 782 172 which provides, again in combination, that a plasma is generated capacitively by way of DC-operation of a target as well as inductively by way of HF-operation of an induction coil for the sputter-treatment of work pieces. In one embodied example the induction coil is located inside the vacuum recipient, and in the other embodied example the induction coil is embedded in the dielectric wall. At any rate, at least one cylindrical screen, consisting of a dielectric or a metallic material, is envisioned between the discharge chamber and the induction coil. The screen is equipped with at least one slot running parallel to the axis or with a few continuous slots that are distributed around the circumference of the screen dividing the screen into separate segments.

On the basis of U.S. Pat. No. 5,569,363 and European Patent No. 0 782 172 it is assumed that, irrespective of the fact whether the slotted screen is manufactured from a metallic or from a dielectric material, the electrically conducting interference layer is caught on the screen. Already a single slot will prevent the development of circular currents in the conductive interference layer; however, several evenly distributed slots will, obviously, help achieve better symmetry of the discharge conditions. To avoid that electrically conducting interference layers become deposited on the induction coil or on the dielectric wall because they penetrated through the slots of the one screen, a second coaxial screen is envisioned in accordance with EP-A, which is realized like the screen referred to previously, but the slots are offset at an angle in relation to the former screen.

It can be noted that irrespective of whether the screen is manufactured from a dielectric material or from metal its surface area that is directed toward the discharge chamber will become electrically conducting due to the electrically conducting interference layer.

On the basis of a vacuum treatment chamber for work pieces with at least one induction coil, which is intended to produce a treatment plasma, at least in part, inside a discharge chamber and is located inside the coil, as well as a slotted screen, which is located between the discharge chamber and the coil, in particular arranged in a coaxial direction in relation to the axis of the coil, and whose slots have a direction component that is parallel to the axis, in accordance with the vacuum chamber that is described in European Patent No. 0 782 172 it is the subject matter of the current invention to decisively neutralize the reduction of inductively injected power into the discharge chamber if an electric interference layer is on the screen and, at the same time, to reduce the down-time of the treatment chamber due to the exchange of interference-coated screens.

For now, irrespective of the fact whether the screen consists of metal or of a dielectric material, the present invention relies on the realization that if the inside surface of the screen is electrically conductive—at least if an electrically conductive interference layer is present—it is in fact eddy currents that cause to a crucial degree of the losses of inductively injected power and not—at least not exclusively—circular currents, as outlined in particular in accordance with U.S. Pat. No. 5,569,369. Consequently, according to the invention the screen is equipped with a high slot density. This high density of slots can only be realized in a user-friendly fashion if the body that is used for the screen is self-contained, which, moreover, achieves the objective of allowing for a fast replacement of the screen.

In a preferred embodied example the selected slot density S (number of slots per cm) is $1 \leq S$, preferably even $1.5 \leq S$;

preferably the slot width d is $d \leq 2$ mm, preferably $d \leq 1$ mm.

The maximum limits for the slot density are derived from the limits prescribed by slot manufacturing and the minimum slot widths that must be observed to avoid, taking into consideration span of the serviceable life, that the narrowing of the slots caused by interference layers, depending on the respective interference layer material, occurs too quickly.

In a preferred example, the screen according to the invention is realized from metal and preferably connected with a reference potential, such as e.g. a ground potential. In contrast to a dielectric screen the metal screen has the advantage, among other advantages, that aside from the electrically conducting interference layer that is building up no other significant change of the inductively injected power results, which is why the preadjusted plasma density in accordance with the inductively injected power will not change much more due to the building interference layer. If the slots are offset in a radial direction, when looked at from a top view, i.e. if viewed in the direction of the axis of the coil, the protective effect of the screen is increased even further against any penetration from the interference layer.

In a particularly preferred embodied example the chamber has a coaxial wall consisting of dielectric material. The screen is located inside this wall and the induction coil is arranged inside or outside of this wall.

Another preferred embodied example provides that at least one pair of electrodes is envisioned inside the chamber, and the pair of electrodes is connected with a DC-source, an AC-source, an AC+DC-source, a pulsating DC-source, preferably an HF- or DC- source. The coil excites the operating plasma inductively and the electrode pair capacitively. Suitable as electrode or electrode pair can be a sputtering source, such as a magnetron source or a substrate support. Preferably, the induction coil is operated with a medium frequency generator that operates at medium frequency $f_m$:

100 kHz $\leq f_m \leq$ 800 kHz, preferably $f_m$=approximately 400 kHz.

Even if the narrow-slotted screen envisioned according to the invention, whose slots do not have to be parallel to the axis but can also be arranged at an oblique angle with regard to this aspect, consists of metal, depending on the type of material during the build-up of the interference layer, a change with regard to the inductively injected power takes place. This occurs even more massively, if the screen according to the invention is manufactured from a dielectric material. In an effort to at least counteract these problems and in order to maintain the plasma's operational conditions at a level that is as constant as possible or that involves intended time-related changes a measuring apparatus is envisioned on the treatment chamber according to the invention for the plasma density in one preferred embodied example; preferably this is a voltage measuring apparatus on an electrode, for example on a work piece support or on a sputtering target, whose starting signal is fed into the control circuit as a measured ACTUAL value, and the control circuit acts as a final control element on the generator for the induction coil.

In another embodied example the slotted screen according to the invention that is inside the vacuum chamber can be used to separate the discharge chamber from a circular chamber, which is arranged radially and outside and into which a gas line runs. Consequently, the screen and its slots are utilized also as a means to jet-feed the gas into the discharge chamber forming a slot ring jet apparatus. During reactive processes the inert working gas, such as argon, is preferably jet-fed through the screen referred to previously, a process that will additionally delay the effective layer buildup capacity with an electrically conductive interference layer.

The method according to the invention can be further used, in particular in connection with sputter-etching of metallic layers, sputter-coating of work pieces, such as e.g. of thin film head for magnetron-sputtering. As referred to previously, it can also be utilized for other plasma-supported treatment methods in which the plasma is, at least in part, inductively excited, such as in the context of PECVD processes and reactive sputtering-processes, such as sputter-coating or sputter-etching processes.

Other objects, advantages and novel features of the present invention will become apparent from the following detailed description of the invention when considered in conjunction with the accompanying drawings.

DETAILED DESCRIPTION OF THE PREFERRED EMBODIMENT

The invention is illustrated in more detail using the figures. Shown are in:

Figure 5:
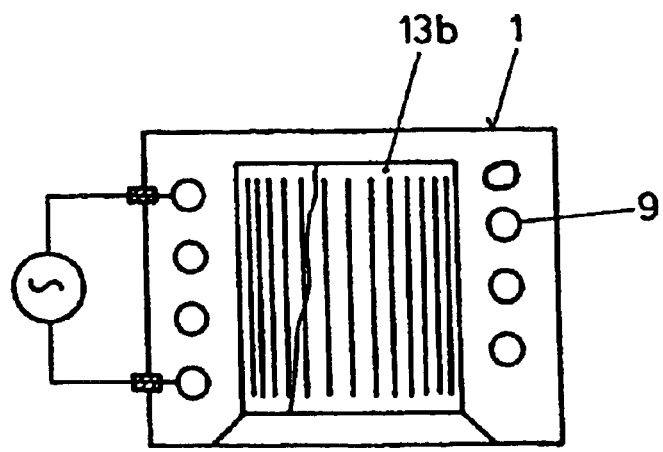
FIG. 5 is a schematic view of a first embodied example of the vacuum treatment chamber according to the invention with the induction coil arranged inside the chamber.
Figure 6:
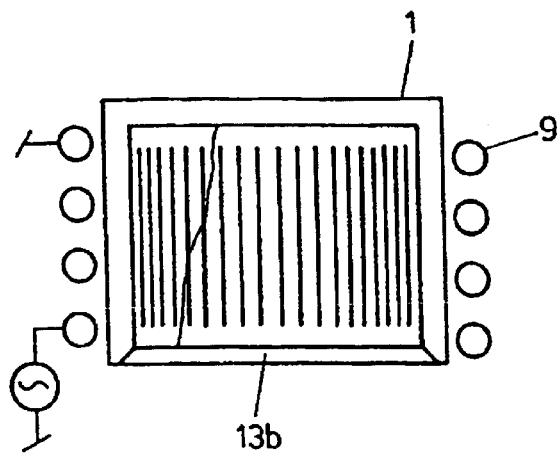
Figure 7:
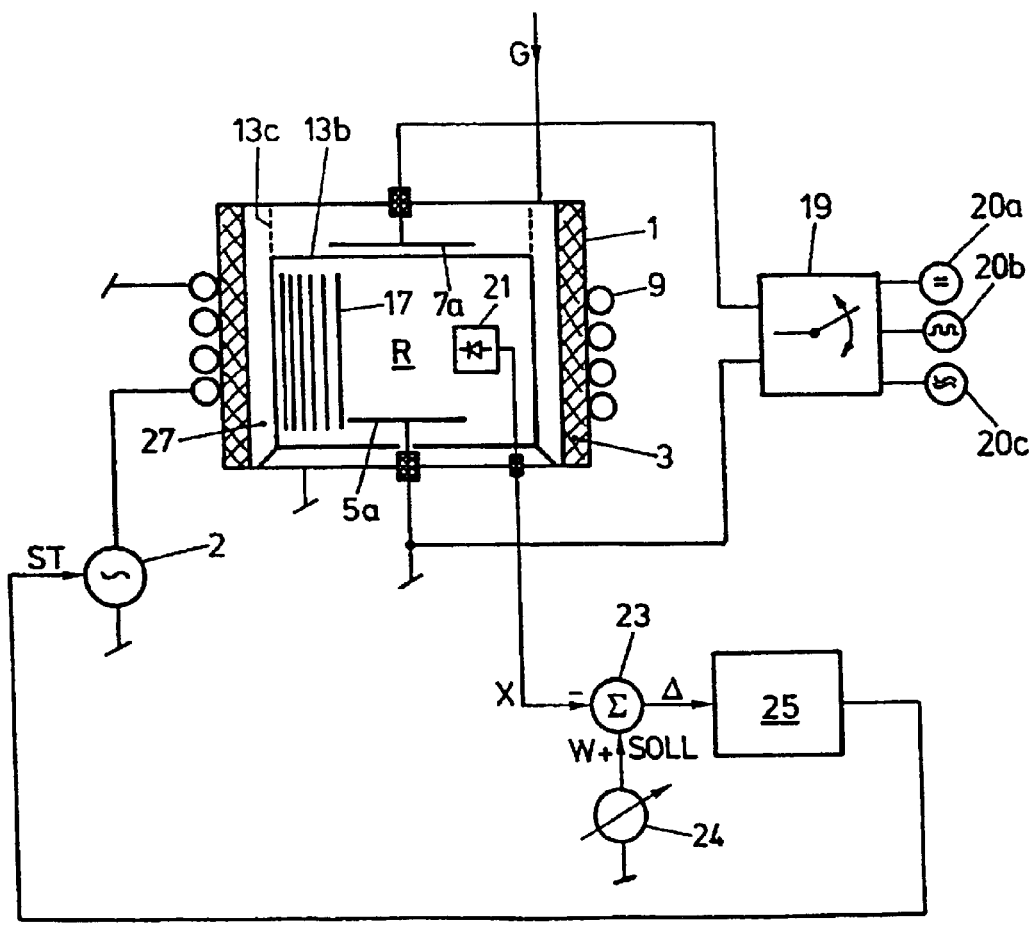

FIG. 6 is an analogous view of FIG. 5 of a vacuum treatment chamber according to the invention with the induction coil located outside of the chamber; and FIG. 7 is a schematic view of another preferred embodied example according to the invention of the vacuum treatment chamber according to the invention, which is an analogous view of FIG. 5 and FIG. 6, for sputter-etching or sputter-coating of work pieces.

DETAILED DESCRIPTION OF THE DRAWINGS

Figure 1:
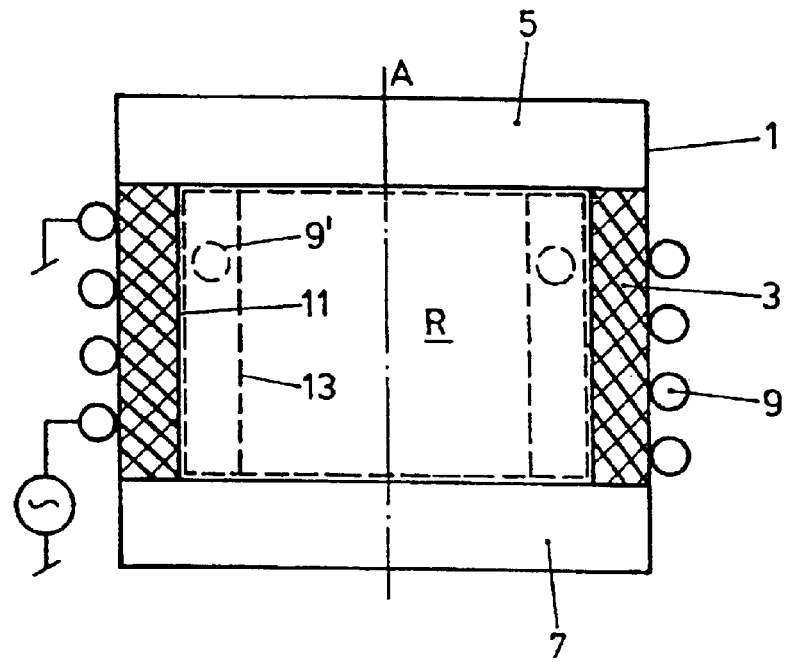
FIG. 1 is a schematic view of a vacuum treatment chamber with inductive plasma excitement for the purpose of explaining the problems that form the basis of the present invention.

FIG. 1 shows a schematic depiction of a vacuum chamber 1 which has a cylindrical, dielectric wall 3 with the front side metallic ends 5 and 7. On the one hand, the wall 3 consists of dielectric material in order to be able to electrically separate the front walls 5 and 7 from one another during electrode operation, for the purpose of capacitive plasma excitation, on the other hand, in order for an induction coil 9 with axis A, that is located outside of the chamber 1, to be able to inductively inject power into the discharge chamber R. If during the treatment of a work piece, irrespective of the type of work that is performed, electrically conducting particles are released into the discharge chamber R, such as is the case e.g. during sputter-etching of conductive surfaces, during sputter-coating with conductive layers but also with PECVD processes, plasma-supported, reactive etching and coating processes, the inside lining, in particular the inside surface of the dielectric wall 3 becomes coated with an electrically conductive layer, as schematically depicted in 11. Therefore, with increasing thickness of the layer the power that is inductively injected into the discharge chamber R changes.

If, as an exception, the induction coil is arranged inside the vacuum chamber, as indicated with the perforated line at 9', and freely exposed to the discharge chamber R, an apparatus in which dielectric spacers in accordance with the wall 3 are now used for the electrical separation—possibly as plates 5 and 7 used as electrodes—the coil 9' is covered with an electrically conducting interference layer, a coating that will peel off in the end and contaminate the treatment process.

To remedy these difficulties it is known in the art, as has been outlined at the outset, to envision a screen apparatus 13 between the discharge chamber R and the induction coil 9' or the dielectric wall 3. On the one hand, the screen is intended to reduce the negative effects of the electrically conductive interference layer vis-à-vis the inductive power injection into the discharge chamber R, but also to ensure, on the other hand, the best possible inductive power injection.

Figure 2:
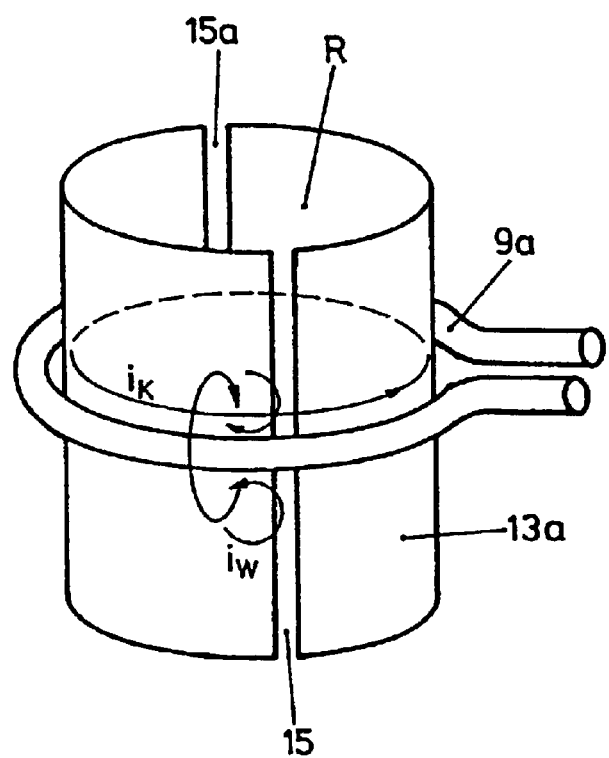
FIG. 2 shows the occurrence of circular currents if a metallic or dielectric cylindrical, self-contained screen is envisioned in accordance with FIG. 1, and the elimination of the circular currents according to the state of the art, furthermore, induced eddy currents that are not eliminated by the state of the art.

FIG. 2 shows a schematic depiction of an induction coil 9a according to 9 in FIG. 1, which encloses at least one, due to the interference layer in accordance with FIG. 1, electrically conductive screen 13a. Based on the induction effect, circular currents $i_x$ occur initially on the enclosed cylinder, in particular in the way that is depicted schematically in FIG. 2. Moreover, eddy currents $i_w$ are also generated—as depicted—whose consequences cannot be ignored, as has been determined according to the invention. According to approaches that are known in the art the circular currents are eliminated by incorporating slots in the screen 13a, as shown in FIG. 2 with symbols 15, 15a, and the effectiveness of the induction power into the discharge chamber R is maintained as much as possible; specifically, this is accomplished by realizing the screen 13a from a dielectric material or by envisioning several, distributed, relatively wide slots 15 or 15a.

Figure 3:
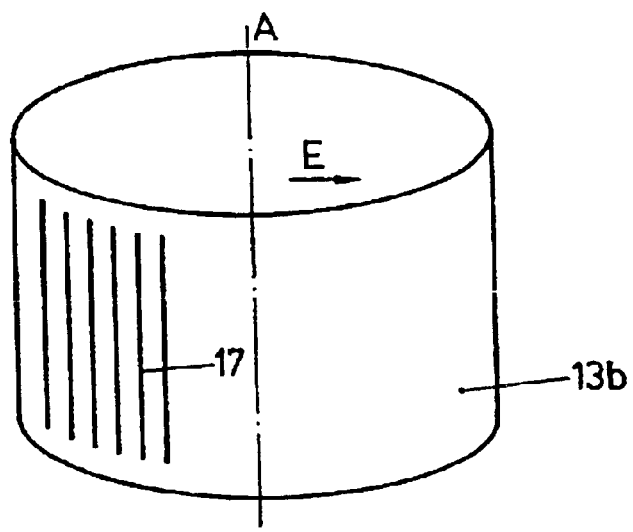
FIG. 3 is a schematic view of screen used on a vacuum chamber according to the invention for treating a work piece according to the invention.

FIG. 3 shows a screen 13b according to the invention as it is used in connection with a chamber according to the invention as depicted—with the exception of the screen—in principle in FIG. 1. The screen 13b is realized as a self-contained body, for example as a cylinder screen. Its mantle surface is slitted with slots 17 arranged in close succession. The slots run, at least in one direction component, parallel to the axis A of the screen, preferably, as shown, parallel to the axis. In relation to a length unit E in the direction of the circumference of the screen 13b the density of the slots 17, i.e. the "number of slots per cm," is at least 0.5, preferably at least 1, preferably even 1.5.

The high slot density massively reduces the development of eddy currents $i_w$ on the screen 13b according to the invention; this occurs irrespective of whether the screen consists of metal, such as aluminum, as preferred, or whether the screen is made of dielectric material that subsequently has an electrically conductive interference layer.

Figure 4:
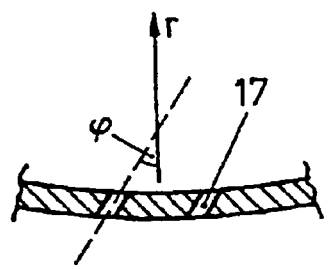
FIG. 4 shows a preferred realization of the slots that are envisioned on the screen according to FIG. 3.

The slots 17 are realized at a preferred width d of a maximum of 2 mm, preferably at the width of at the most 1 mm, for example, by way of a water-torching process. As seen in FIG. 4, if viewed in the direction of the axis A, and visible on a cross-section of the screen according to FIG. 3, the slots 17 are preferably inclined in relation to the radial direction r by $\Phi$, which additionally improves the protective effect of the screen with respect to the escaping of particles from the discharge chamber R.

Preferably the angle $\Phi$ is between 30° and 40° in relation to the radial direction r.

As mentioned previously, the screen 13b consists preferably of metal, thus making it possible to operate the screen inside the chamber according to the invention and bound to a reference potential.

Primarily based on the high slot density S the used screen according to the invention consists of an integral part, which also simplifies its handling if the screen has to be replaced from a chamber according to the invention. This results in a considerable reduction of the down-times.

As can be seen easily in the schematic depiction in FIG. 5 and/or FIG. 6 the induction coil 9 can be envisioned inside or—as seen in FIG. 1—outside of the treatment chamber 1 according to the invention using the screen 13b, which is explained in FIG. 3 and FIG. 4. A chamber according to the invention and/or the treatment method according to the invention will always be employed in such instances when an electrically conducting interference layer is formed in connection with the vacuum treatment processes during which plasma is, at least in part, inductively generated.

FIG. 7 is a schematic depiction of a preferred variant of an embodied example of the vacuum chamber according to the invention for the treatment of work pieces according to the invention. The same reference symbols are used here as were used for parts that have already been explained in connection with FIGS. 1 to 6. The plasma in the discharge chamber R of the vacuum chamber 1 is generated inductively, by way of the induction coil, as well as capacitively, by way of the at least one pair of electrodes 7a, 5a. To generate plasma in capacitive manner it is possible, as shown schematically with the possibility of a select switch 19, to use a DC generator 20a, for example for reactive or non-reactive DC-sputtering—coating or etching—DC-magnetron sputtering. Alternatively, an AC+DC generator 20b or an HF generator 20c can be connected, for example for reactive or non-reactive high frequency sputter-etching or sputter-coating. The screen 13b, preferably consisting of metal, is connected with a reference potential, such as e.g. a ground potential.

As further schematically shown in FIG. 7, in another preferred embodied example the plasma density in chamber R is measured with a measuring apparatus 21, and the measured result X is fed into a differentiator unit 23 as a measured ACTUAL value. This unit compares the current ACTUAL value with a DESIRED value or DESIRED value development W that is predetermined at a final control element unit 24. As control difference A the comparison result is put via the control 25 to at least one regulating input ST on the generator 2 that supplies the induction coil 9 as a final control element for the plasma density in the plasma density control circuit shown. Preferably, the generator 2 operates, as outlined previously, in the medium frequency range, in particular between 100 and 800 kHz, preferably in the 400 kHz range.

In the context of HF sputter-etching, for example, a voltage measuring device is envisioned as a measuring apparatus 21 that will measure the bias voltage on the substrates or on a substrate support, while, analogously to HF sputter-coating, the bias voltage is measured on the target side as ACTUAL value indication.

If, as shown schematically in FIG. 7 with perforated lines at item 13$c$, the screen 13$b$, $c$ separates the discharge chamber R from an outer chamber 27, it is easily possible to use the screen 13$b$, $c$ at the same time as a distribution jet, in particular as a distribution jet for the working gas. The gas G is then allowed to enter the referred to outer chamber. In particular, if a reactive, plasma-supported process is carried out in the vacuum chamber 1 according to the invention, it is possible to further slow down a interference layer build-up on the screen, in particular in the slot area, if an inert working gas, such as argon, is blown through the screen slots 17. A reactive gas such as e.g. oxygen or another separating gas, is then preferably guided to the proximity of the substrate, e.g. via a ring line.

In a chamber according to the invention equipped with a screen 13$b$ as shown in FIG. 7 that was operated as an HF sputter-chamber and at different working pressures inside the discharge chamber R during several ten hours of continuous operation, performing sputtering of metals, the realized reduction of the injected inductive power was, depending on pressure, at the most at 10%. Using the control circuit outlined in connection with FIG. 7 the process operating point was additionally stabilized by tracking the inductive generator capacity.

Using the method according to the invention, preferably as shown in FIG. 7, it is possible to sputter DC-diodes, i.e. by using two (di-) electrodes 5$a$, 7$a$ in DC-operation and without a magnetic field. High rates result with the combination of inductive/capacitive plasma generation while avoiding interfering magnetic stray fields, accompanied by excellent target utilization.

foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vacuum treatment chamber for workpieces comprising a treatment space in which the workpieces are treated, at least one induction coil encircling said treatment space and having a coil axis at least for contributing to generation of a plasma within said treatment space for excitation of a plasma thereat, a self-contained hollow screen body having an inner surface and an outer surface configured as a substantially thin-walled cylindrical member so as to be replaceable as a unit, said hollow screen body being arranged substantially coaxially to said coil axis within said treatment space, the inner surface of said hollow screen body being freely exposed to said treatment space, said hollow screen body having a pattern of through-slots extending substantially in a direction of said coil axis and being distributed around said coil axis to allow for direct line-of-sight paths along the through-slots from the outer surface to the inner surface of said hollow screen body, with a density S of said slots of said pattern per cm taken in a circumferential direction of said screen body being at least 0.5.

2. The vacuum treatment chamber of claim 1, wherein said vacuum chamber further comprises a dielectric material chamber wall, and said at least one induction coil is mounted one of outside and of inside said chamber wall.

3. The vacuum treatment chamber of claim 1, further comprising at least two electrodes mutually distant from each other inside said treatment chamber and facing said treatment space, said at least two electrodes being operatively connected to an electric supply source selected from the group consisting of a DC source, and AC source, an AC+DC source, pulsed DC source, and an Rf-source so as to contribute to generating said plasma.

4. The vacuum treatment chamber of claim 1, further comprising a plasma density measuring apparatus and configured to output a signal indicative of instantaneously prevailing plasma density of said plasma, the output thereof being operatively connected as an actual value input of a negative feedback control circuit whose output is operatively connected to said at least one induction coil for adjusting said plasma density.

5. The vacuum treatment chamber of claim 4, wherein said plasma density measuring apparatus comprises a voltage measuring apparatus having an input, operatively connected to an electrode arranged to be exposed to said plasma.

6. The vacuum treatment chamber of claim 4, wherein said plasma density measuring apparatus is mounted to one of a workpiece support and a target electrode within said vacuum treatment chamber.

7. The vacuum treatment chamber of claim 1, wherein $S \geq 1$.

8. The vacuum treatment chamber of claim 1, wherein the through slots have a width d, wherein $d \leq 2$ mm.

9. The vacuum treatment chamber of claim 1, wherein the screen comprises metal and is connected with an electrical reference potential.

10. The vacuum treatment chamber of claim 7, wherein the slots, viewed from above and in an axial direction, are offset ($\Phi$) in relation to the radial direction (r).

11. The vacuum treatment chamber of claim 2, whereby said density S is selected to be $\geq 1$.

12. The vacuum treatment chamber of claim 2, further selecting a width d of said through-slots to be $\leq 2$ mm.

13. The vacuum treatment chamber of claim 1, further selecting a width d of said through-slots to be $\leq 1$ mm.

14. The vacuum treatment chamber of claim 1, wherein said screen body is operatively electrically connected on a reference potential.

15. The vacuum treatment chamber of claim 1, wherein the maximum width of the slots is 2 mm.

16. A method for manufacturing vacuum surface treated workpieces, comprising:

evacuating a vacuum treatment chamber;

introducing a workpiece into a treatment space of said vacuum chamber;

generating in said treatment space a plasma, at least partially inductive with the use of a coil surrounding said treatment space;

providing a self-contained hollow screen body with an inner surface and with an outer surface configured as a substantially thin-walled cylindrical member so as to be replaceable as a unit and arranged coaxially to said coil within said treatment space, with said inner surface being freely exposed to said treatment space;

said hollow screen body having a pattern of through-slots extending substantially in a direction of an axis of said coil and distributed around said coil axis to provide direct line-of-sight paths along the through slots from the outer surface to the inner surface of said hollow screen body, a density S of said slots of said pattern per cm taken in a circumferential direction of said screen body being at least 0.5; and surface-treating in said treatment space said workpiece exposed to said plasma.

17. The method of claim 16, further comprising generating during said surface-treating of said workpiece electrically conductive material freed into said treatment space.

18. The method of claim 16, further comprising providing said screen body of metal material.

19. The method of claim 16, further comprising exchanging said screen body when said inner surface thereof has been saturated by said surface-treating of said workpiece to a predetermined extent.

20. The method of claim 16, wherein surface treating of said workpiece is one of sputter-etching and sputter-coating.

21. The method of claim 16, further comprising separating, by said screen body, said treatment space from a further space around said outer surface of said screen body, and feeding gas into said vacuum treatment chamber and thereby into said further space.

22. The method of claim 16, thereby selecting said density S to be $\geq 1$.

23. The method of claim 16, further selecting a width d of said through-slots to be $\leq 2$ mm.

24. The method of claim 16, further comprising operatively connecting said screen body electrically on a reference potential.

25. The method of claim 16, further comprising additionally generating said plasma by at least two electrodes exposed to said treatment space capacitively, thereby feeding said at least two electrodes by one of DC, AC, AC+DC, pulsed DC and Rf.

26. The method of claim 16, further comprising monitoring an actual value of density of said plasma and negative-feedback controlling said density by adjusting an induction field generated by said coil within said plasma.

27. The method of claim 16, wherein the coil is operated at a frequency fm of $100$ kHz $\leq$ fm $\leq 800$ kHz.

28. The method of claim 16, wherein the coil is operated with a frequency fm of about 400 kHz.

* * * * *